(12) United States Patent
Akutsu (10) Patent No.: US 7,041,237 B2
(45) Date of Patent: May 9, 2006

(54) ADHESIVE AND ELECTRIC DEVICE

(75) Inventor: Yasushi Akutsu, Kanuma (JP)

(73) Assignee: Sony Corporation, Tokyo (JP)

( * ) Notice: Subject to any disclaimer, the term of this patent is extended or adjusted under 35 U.S.C. 154(b) by 408 days.

(21) Appl. No.: 10/312,043

(22) PCT Filed: Apr. 25, 2002

(86) PCT No.: PCT/JP02/04134

§ 371 (c)(1),
(2), (4) Date: Dec. 23, 2002

(87) PCT Pub. No.: WO02/088270

PCT Pub. Date: Nov. 7, 2002

(65) Prior Publication Data

US 2003/0155556 A1    Aug. 21, 2003

(30) Foreign Application Priority Data

Apr. 27, 2001  (JP) .............................. 2001-132181

(51) Int. Cl.
*H01B 1/00* (2006.01)
*H01L 23/58* (2006.01)

(52) U.S. Cl. .................. 252/511; 252/518.1; 252/502; 252/514; 257/783; 257/789; 438/644

(58) Field of Classification Search ................ 252/511, 252/518.1; 257/783, 789, 734; 438/119, 438/644; 156/99
See application file for complete search history.

(56) References Cited

U.S. PATENT DOCUMENTS

| 6,410,642 B1 * | 6/2002 | Yamakawa et al. | ......... 524/847 |
| 6,750,550 B1 * | 6/2004 | Yamakawa et al. | ......... 257/783 |
| 6,812,065 B1 * | 11/2004 | Kitamura | .................. 438/119 |

FOREIGN PATENT DOCUMENTS

| EP | 1 085 790 A1 | 3/2001 |
| JP | A 62-143986 | 6/1987 |
| JP | 06-009754 A2 * | 1/1994 |
| JP | A 2000-239627 | 9/2000 |
| JP | 2001-049220 * | 2/2001 |
| JP | A 2001-49220 | 2/2001 |
| KR | 2000-309768 * | 11/2000 |

* cited by examiner

*Primary Examiner*—Mark Kopec
*Assistant Examiner*—Kallambella Vijayakumar
(74) *Attorney, Agent, or Firm*—Oliff & Berridge, PLC (57) ABSTRACT

The particle diameter distribution of the filler material added to the adhesive of the invention has the first peak and the second peak positioned on a side of smaller particle diameters with respect to the first peak by 0.7μ or more, and thus the rigidity of the hardened adhesive is improved. Therefore, the connection reliability of the electric device 5 having the semiconductor chip 11 and the substrate 13 by using the adhesive (adhesive film 15) is improved.

11 Claims, 5 Drawing Sheets

ADHESIVE AND ELECTRIC DEVICE

TECHNICAL FIELD

The present invention relates to an adhesive, and particularly relates to an adhesive for connecting a semiconductor chip to a substrate.

BACKGROUND ART

An adhesive formed with a thermosetting resin or a thermoplastic resin has been used to adhere a semiconductor chip to a substrate.

Figure 7:
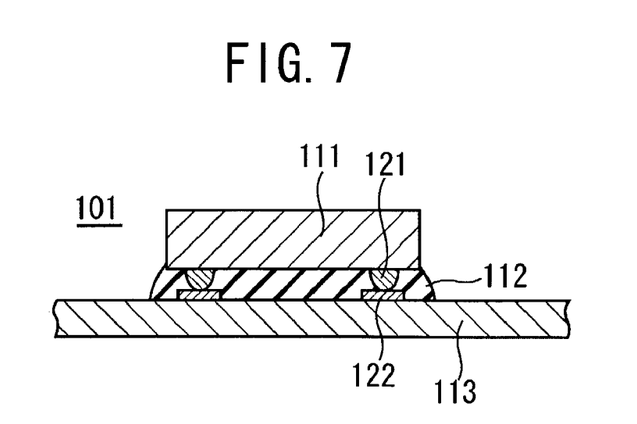
FIG. 7 is a diagram for explaining a conventional adhesive.

In FIG. 7, numeral 101 denotes an electronic device containing a semiconductor chip 111 attached to a substrate 113 with an adhesive 112. A bump terminal 121 of the semiconductor chip 111 is in contact with a terminal 122 formed with a part of a wiring pattern on the substrate 113. Under the conditions, an inner circuit of the semiconductor chip 111 is electrically connected to the wiring pattern on the substrate 113 through the terminals 121 and 122. A resin constituting the adhesive 112 has been hardened, and the semiconductor chip 111 and the substrate 113 are mechanically connected to each other with the adhesive 112.

However, because the thermal expansion coefficient of the resin used in the adhesive is generally larger than the thermal expansion coefficient of the semiconductor chip 111, when the electric device 101 shown in FIG. 7 is allowed to stand under high temperature and high humidity conditions, the semiconductor chip 111 is released from the adhesive 112 with a stress occurring at an interface between the adhesive 112 and the semiconductor chip 111 due to the difference in thermal expansion coefficient.

In order to solve the problem, such methods have been employed that an inorganic filler is dispersed in the adhesive 112 to lower the thermal expansion coefficient and the water absorption property of the adhesive 112, and a rubber component is added to the adhesive 112 to lower the elasticity of the adhesive 112 in a hardened state.

However, there are some cases where the adhesive 112 having the inorganic filler or the rubber component dispersed therein causes cracks inside the adhesive 112 due to sudden change in temperature. Particularly, in the case where the filler is added, the rigidity of the adhesive 112 having been hardened is low, and thus cracks is further liable to occur inside the adhesive 112.

In the case where the rubber component is excessively dispersed in the adhesive 112, the thermal expansion coefficient is increased, and as a result, the reliability of the resulting electronic part is lowered. In any case, it is difficult to obtain an electronic part of high reliability by using the conventional adhesive.

DISCLOSURE OF THE INVENTION

The invention has been created to solve the disadvantages associated with the conventional techniques, and an object thereof is to provide an adhesive of high reliability.

Upon applying stress due to temperature change (thermal stress) to an adhesive in a hardened state, expansion and contraction locally occur by temperature gradient inside the adhesive to generate internal stress. When the internal stress exceeds the cohesive force for forming aggregate of the adhesive, cracks and the like are formed in the adhesive to break the aggregate of the adhesive.

The resistance to the thermal stress (thermal shock resistance $R_t$) is expressed by the following equation (1).

$$R_t = \beta S / \alpha E \quad (1)$$

In the equation, $\beta$ represents a thermal conductivity coefficient, S represents a mechanical strength (rigidity), $\alpha$ represents a thermal expansion coefficient, and E represents an elastic modulus.

It is apparent from the equation that in order to increase the thermal shock resistance $R_t$ of the adhesive, it is necessary that the rigidity and the thermal conductivity coefficient of the adhesive are increased, and at the same time, the thermal expansion coefficient and the elastic modulus are suppressed to certain extent.

As the presence of a filler is indispensable for decreasing the thermal expansion coefficient and the absorbability of the adhesive, the inventors of the invention have paid attention to a filler material, and as a result of cumulative investigations, they have found a method for improving the cohesive force of filler particles by making the particle diameter of the filler particles contained in the filler material nonuniform.

Figure 5:
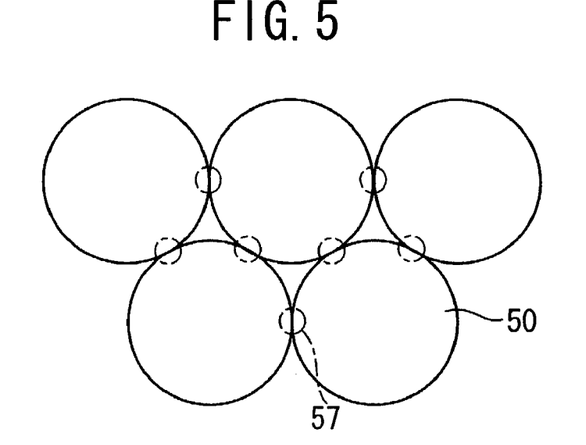
FIG. 5 is a diagram for explaining a filler material having a uniform particle diameter.
Figure 6:
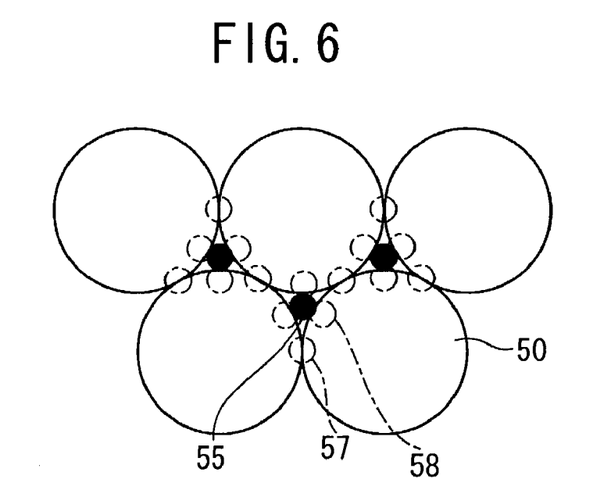
FIG. 6 is a diagram for explaining a filler material having a nonuniform particle diameter.

FIG. 5 shows an example where the particle diameter of the filler particles 50 is uniform, and FIG. 6 shows an example where the particle diameter of the filler particles is nonuniform. With reference to FIG. 6, in the case where the particle diameter of the filler particles 50 and 55 is nonuniform, the filler particles 55 having small diameters enter gaps among the filler particles 50 having large diameter, and thus the filler particles are packed at a high density.

Symbol 57 in FIG. 5 and FIG. 6 denotes positions where the filler particles 50 having large diameters are in contact with each other, and symbol 58 in FIG. 6 denotes positions where the filler particle 50 having large diameters and the filler particles 55 having small diameters are in contact with each other. In the case shown in FIG. 6, the number of the positions 57 and 58 where the filler particles 50 and 55 are in contact with each other is large in comparison to the case shown in FIG. 5, and thus the frictional caused by the contact of the filler particles 50 and 55 is also increased. As a result of the fact that the filler particles are packed at a high density to increase the frictional force thus formed, the cohesive force of the filler material is increased, and therefore, the rigidity of the entire adhesive is improved.

The invention has been developed based on the foregoing findings, and the invention provides an adhesive containing a filler material, electroconductive particles and a resin, the filler material having a particle diameter distribution having a first peak and a second peak positioned on a side of smaller particle diameters with respect to the first peak, and a difference between a particle diameter, at which the first peak is positioned, and a particle diameter, at which the second peak is positioned, being 0.7 µm or more.

It is preferred in the invention that the particle diameter, at which the second peak is positioned, is 1 nm or more, and the particle diameter, at which the first peak is positioned, is 20 µm or less.

It is preferred in the invention that the filler material contains two or more kinds of filler components that have average particle diameters different from each other. In this case, it is preferred that the filler components contain one or both of silica and alumina.

It is preferred in the invention that the adhesive has been previously semihardened and shaped into a sheet form.

The invention provides an electric device containing a semiconductor chip, a substrate and the adhesive of the invention arranged between the semiconductor chip and the substrate and hardened by a heat treatment.

The invention is thus constituted as in the foregoing, and because the particles of the filler component constituting the second peak is smaller than the particles of the filler component constituting the first peak by 0.7 μm or more, the filler particles constituting the second peak enter gaps among the filler particles constituting the first peak.

Therefore, the frictional force caused by contact of the filler particles is increased, and the rigidity of the hardened adhesive of the invention is increased.

The filler material having a particle diameter distribution having the first and second peaks can be easily produced by mixing two kinds of filler components having average particle diameters different from each other. It is also possible that one kind of filler is partially pulverized to make the particle diameter nonuniform to form the filler material.

The particle diameter distribution in the invention means a distribution of the content of the filler particles (number of the filler particles) contained in the filler component with respect to the particle diameter (μm).

In order to make the rigidity of the hardened adhesive sufficiently high, it is necessary in the adhesive of the invention that the addition amount of the filler material is as relatively high as about from 30 to 70% by weight. When a filler having electroconductivity is filled at a high density, there are cases where the semiconductor chip and wiring of the substrate as the adherends are shorted, and thus it is preferred in the invention that a filler component having insulation property is used.

BEST MODE FOR CARRYING OUT THE INVENTION

The adhesive of the invention will be described along with the production process of the electric device using the adhesive with reference to the drawings.

EXAMPLE 1

To 60 parts by weight of an epoxy resin as a thermosetting resin material, 30 parts by weight of electroconductive particles (diameter: 5 μm) formed with resin particles having a gold plating layer and a nickel plating layer (metal plating resin particles) and 60 parts by weight of a filler material formed with two kinds of filler components having average particle diameters different from each other were added, and they were sufficiently mixed to obtain an adhesive in a paste state. Silica having an average particle diameter of 1.6 μm (filler component A) and silica having an average particle diameter of 0.9 μm (filler component B) were used as a filler herein, and a mixture formed by adding 1 part by volume of the filler component B to 2 parts by volume of the filler component A was used as the filler material.

Subsequently, the adhesive is shaped into a film form to produce an adhesive film formed with the adhesive of the invention. Symbol 15 in FIG. 1A denotes the adhesive film, and the adhesive constituting the adhesive film 15 is semi-hardened to such extent that it exhibits free-standing property.

Figure 1A:
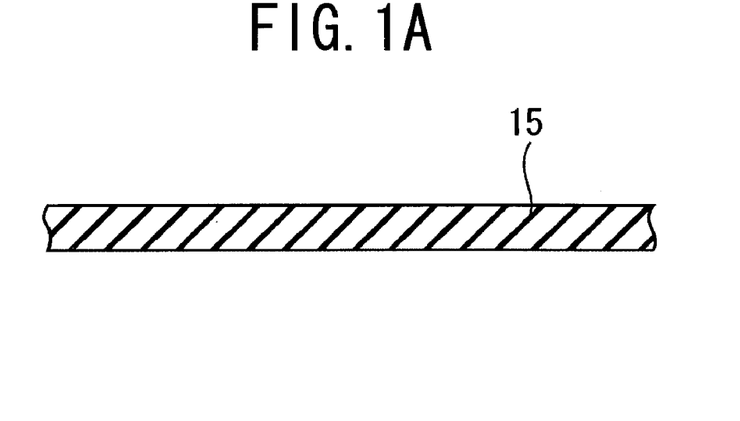
FIGS. 1A to 1C are diagrams showing an example of a method for using the adhesive of the invention.
Figure 1B:
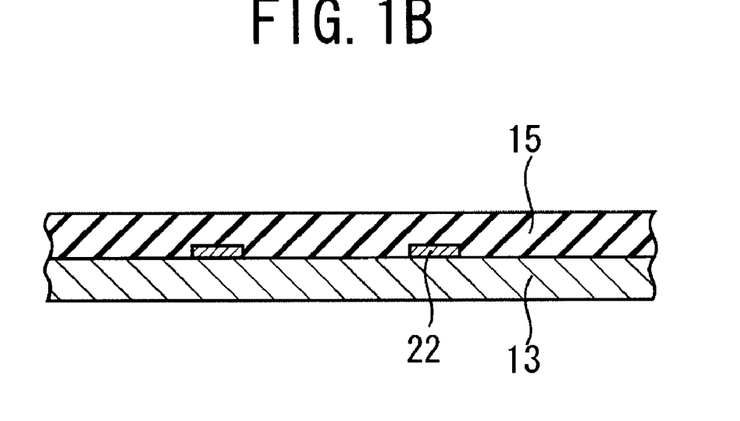

Symbol 13 in FIG. 1B denotes a substrate, and metallic wiring not shown in the figure is arranged on one surface of the substrate 13. Connecting terminals 22 are constituted with a wide part of the metallic wiring, and the connecting terminals 22 are exposed on the surface of the substrate 13. As the substrate 13 herein, a glass based epoxy resin copper laminated accumulated board prepared for an evaluation test (JIS GE2F (NEMA Standard FR-5), thickness: 0.6 mm) was used.

FIG. 1B shows the state where the adhesive film 15 is attached to the surface of the substrate 13, on which the connecting terminals 22 are arranged.

Figure 1C:
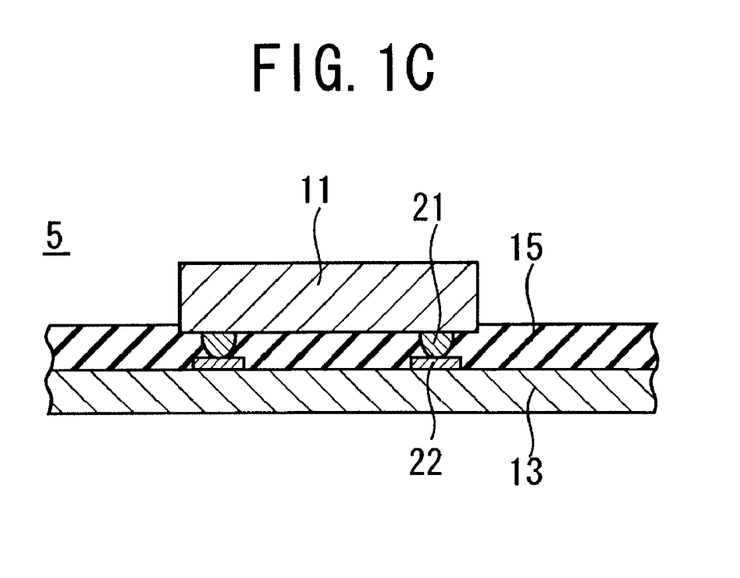

Symbol 11 in FIG. 1C denotes a semiconductor chip. The semiconductor chip 11 has connecting terminals 21 in a bump form protruding from a surface of the semiconductor chip 11, and the connecting terminals 21 are connected to an internal circuit of the semiconductor chip 11. As the semiconductor chip 11 herein, a silicon chip having a size of 6.3 mm square and a thickness of 0.4 mm prepared for an evaluation test was used. The connecting terminals 21 of the semiconductor chip 11 were formed with gold plating bumps of 100 μm square, and the interval of the connecting terminals 21 was 150 μm.

The surface of the semiconductor chip 11, on which the connecting terminals 21 are arranged, is pressed onto the adhesive film 15 on the substrate 13, so as to make the connecting terminals 22 of the substrate 13 in close contact with the connecting terminals 21 of the semiconductor chip 11, and upon heating, the adhesive film 15 is hardened in such a state that the connecting terminals 21 and 22 were made in close contact with each other. The entire assembly was pressed to make a load of 100 g applied to the respective connecting terminals 21 of the semiconductor chip 11, and heating was carried out under condition of 180° C. and 20 seconds.

Symbol 5 in FIG. 1C denotes an electric device in a state where the adhesive film 15 is hardened, and in the electric device 5, the adhesive film 15 is hardened in a state where the connecting terminals 21 and 22 are electrically connected to each other, with the semiconductor chip 11 being fixed on the substrate 13 with the adhesive film 15.

The adhesive film 15 shown in FIG. 1A and the electric device 5 shown in FIG. 1C are designated as Example 1, and the adhesive film 15 of Example 1 and the electric device 5 of Example 1 are subjected to tests for "water absorption", "elastic modulus", "thermal conductivity", "thermal crack test (TCT)" and "pressure cooker test (PCT)" shown below.

The adhesive film 15 of Example 1 was heated at a temperature of 200° C. for 5 minutes to effect complete hardening and was used for the tests for "water absorption", "elastic modulus" and "thermal conductivity".

Separately from these tests, after measuring the conduction resistance (initial resistance) of the respective electric devices 5, the electric devices 5 were stored under conditions of a temperature of 60° C. and a relative humidity of 85% for 168 hours (moisture absorption reflow), and the conduction resistance after the moisture absorption reflow was measured. Cases where the resistance after the moisture absorption reflow was less than twice the initial resistance were designated as "OK", and cases where it was twice or more were designated as "NG". Articles decided as "OK" were further subjected to "thermal crack test (TCT)" and "pressure cooker test (PCT)" shown below.

(Water Absorption)

The adhesive film 15 heated under conditions of 180° C. for 1 hour to be hardened was shaped to prepare a cylindrical test piece having a diameter of 5 mm and a height of 15 mm. The test piece was completely dried in a vacuum oven at 80° C., the weight of the test piece was measured (initial weight). Subsequently, the test piece was stored under conditions of 85° C. and 85% RH for 500 hours (moisture absorption test), and the weight of the test piece was measured.

The initial weight was represented by a, and the weight after the moisture absorption test was represented by b. The values a and b were substituted in the following equation (2) to obtain the water absorption.

Water absorption (%)=$(b-a)/a \times 100$   (2)

(Elastic Modulus)

The hardened adhesive film 15 was cut into a size of 2 mm×5 cm with a thickness of 50 μm to produce a test piece, and the elastic modulus of the test piece at 30° C. was measured by the DMA method (dynamic mechanical analysis) under conditions of a temperature increasing rate of 3° C. per minute and a frequency of 11 Hz. The results are shown in Table 1 below.

(Thermal Conductivity)

The same test piece as used in the test of "elastic modulus" was measured for thermal conductivity by using a quick thermal conductivity meter ("QTM 500J", a trade name, produced by Kyoto Electronics Manufacturing Co., Ltd.) under conditions of 23° C. and 65% RH.

(Thermal Crack Test (TCT))

The electric device 5 after the moisture absorption reflow was stored under conditions of −55° C. for 15 minutes and then stored under conditions of 125° C. for 15 minutes. The operation was designated as one cycle of temperature sudden change, and a conduction test of the electric device 5 was carried out per 200 cycles of temperature sudden change. The number of cycles where the electric resistance thus measured becomes twice or more the initial resistance is shown in Table 1 below.

(Pressure Cooker Test (PCT))

The electric device 5 of Example 1 after the moisture absorption reflow was stored under conditions of 121° C., 2.1 atm and 100% RH (saturated water vapor pressurization), a conduction test was carried out per 100 hours. The time when the conduction resistance thus measured becomes twice or more the initial resistance is shown in Table 1 below.

TABLE 1

Mixing ratio of filler and results of tests

| | Filler mixing ratio (by volume) | Water absorption (%) | Elastic modulus (GPa) (at 30° C.) | Thermal conductivity (W/(m · K)) | Thermal crack test (cycles) | Pressure cooker test (hours) |
|---|---|---|---|---|---|---|
| Example 1 | A/B = 2/1 | 1.3 | 5.0 | 0.45 | 400 | 300 |
| Example 2 | A/B = 1/1 | 1.3 | 5.0 | 0.45 | 200 | 200 |
| Example 3 | A/B = 1/2 | 1.3 | 5.0 | 0.45 | 200 | 100 |
| Example 4 | A/C = 3/1 | 1.3 | 5.0 | 0.45 | 600 | 200 |
| Example 5 | A/C = 2/1 | 1.4 | 5.0 | 0.45 | 1,000 | 500 |
| Example 6 | A/C = 1/1 | 1.4 | 5.0 | 0.45 | 800 | 300 |
| Example 7 | A/D = 1/1 | 1.5 | 6.5 | 0.53 | 1,000 | 500 |
| Example 8 | A/D = 2/1 | 1.5 | 6.2 | 0.49 | 1,000 | 500 |
| Example 9 | A/D = 3/1 | 1.4 | 5.7 | 0.47 | 1,000 | 500 |
| Example 10 | D/E = 1/1 | 1.5 | 6.7 | 0.57 | 1,000 | 500 |
| Example 11 | D/E = 2/1 | 1.5 | 6.3 | 0.57 | 1,000 | 500 |
| Example 12 | D/E = 3/1 | 1.5 | 5.7 | 0.57 | 1,000 | 500 |
| Comparative Example 1 | A = 100% | 1.3 | 5.0 | 0.45 | moisture absorption reflow | moisture absorption reflow |
| Comparative Example 2 | B = 100% | 1.3 | 5.0 | 0.45 | moisture absorption reflow | moisture absorption reflow |
| Comparative Example 3 | C = 100% | 1.4 | 5.0 | 0.45 | moisture absorption reflow | moisture absorption reflow |

A: Silica having an average particle diameter of 1.6 μm
B: Silica having an average particle diameter of 0.9 μm
C: Silica having an average particle diameter of 0.05 μm
D: Alumina having an average particle diameter of 0.05 μm
E: Alumina having an average particle diameter of 1.5 μm EXAMPLES 2 to 12 AND COMPARATIVE EXAMPLES 1 to 3

Adhesive films of Examples 2 to 12 and Comparative Examples 1 to 3 were prepared by using the resin material and the conductivity that were the same as in Example 1 but changing the composition of the filler material used in Example 1. The kinds of the filler materials contained in the filler materials of Examples 2 to 12 and Comparative Examples 1 to 3 and the mixing ratios thereof are as shown in the column of filler mixing ratio in Table 1.

Furthermore, the adhesive films 15 were used with the substrate 13 and the semiconductor chip 11 that were the same as in Example 1, the substrate 13 was connected to the semiconductor chip 11 according to the process shown in FIG. 1B and FIG. 1C, so as to produce electric devices 5 of Examples 2 to 12 and Comparative Examples 1 to 3.

The adhesive films 15 and the electric devices 5 of Examples 2 to 12 and Comparative Examples 1 to 3 were subjected to the tests for "water absorption", "elastic modulus", "thermal conductivity", "thermal crack test (TCT)" and "pressure cooker test (PCT)" under the same conditions as in Example 1. The results of the tests are shown in Table 1.

As apparent from Table 1, the electric devices of Comparative Examples 1 to 3 caused connection failure at the state of the moisture absorption reflow, which was a pretreatment of the thermal crack test and the pressure cooker test, whereas the electric devices 5 of Examples 1 to 12 provided high evaluations in "thermal crack test" and "pressure cooker test" after the moisture absorption reflow, and in particular, higher thermal shock resistance was confirmed in the cases where alumina (filler D and filler E) was used as the filler material.

The filler components A, B and C and the filler materials used in Examples 2 and 6 were subjected to particle size measurement by the laser analysis scattering method using a particle size analyzer ("Microtrac Particle Size Analyzer", a trade name, produced by Nikkiso Co., Ltd.).

Figure 3A:
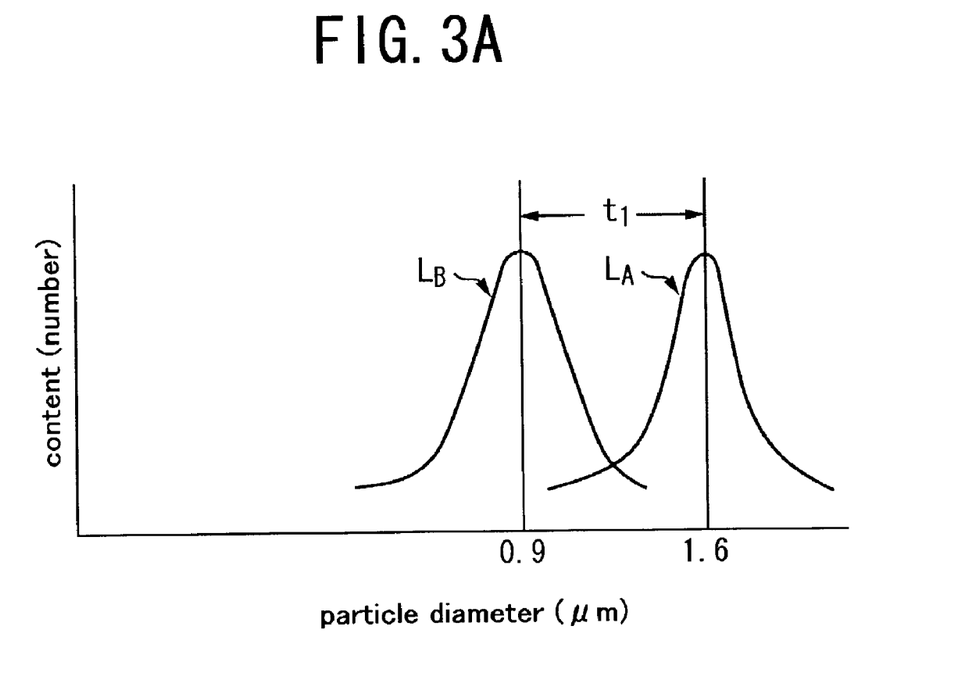
FIGS. 3A and 3B are diagrams for explaining an example of the distribution of the filler component particles in the filler material.
Figure 3B:
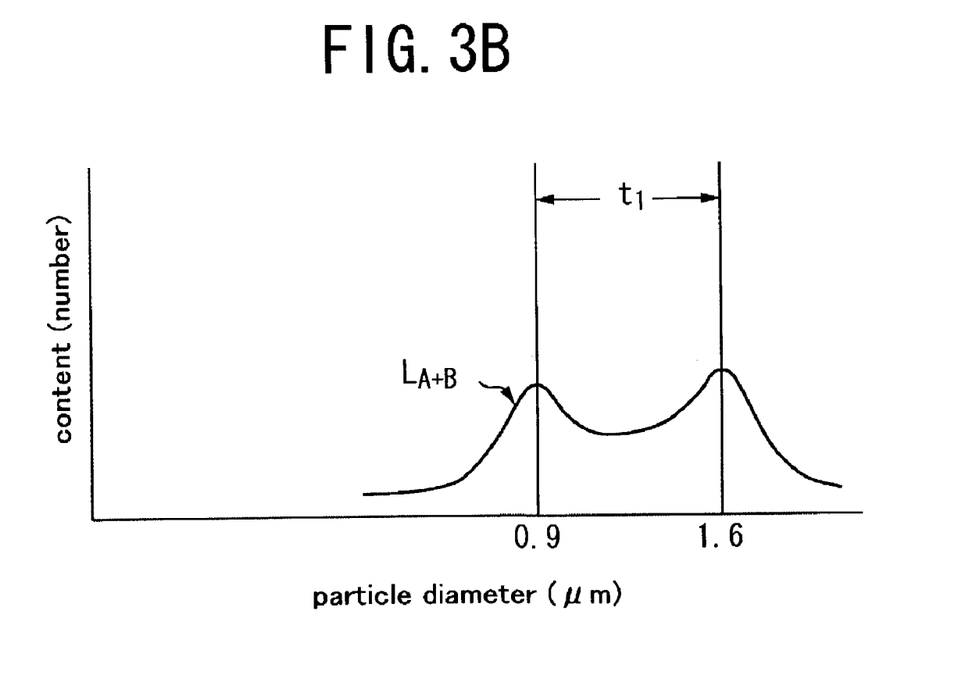
Figure 4A:
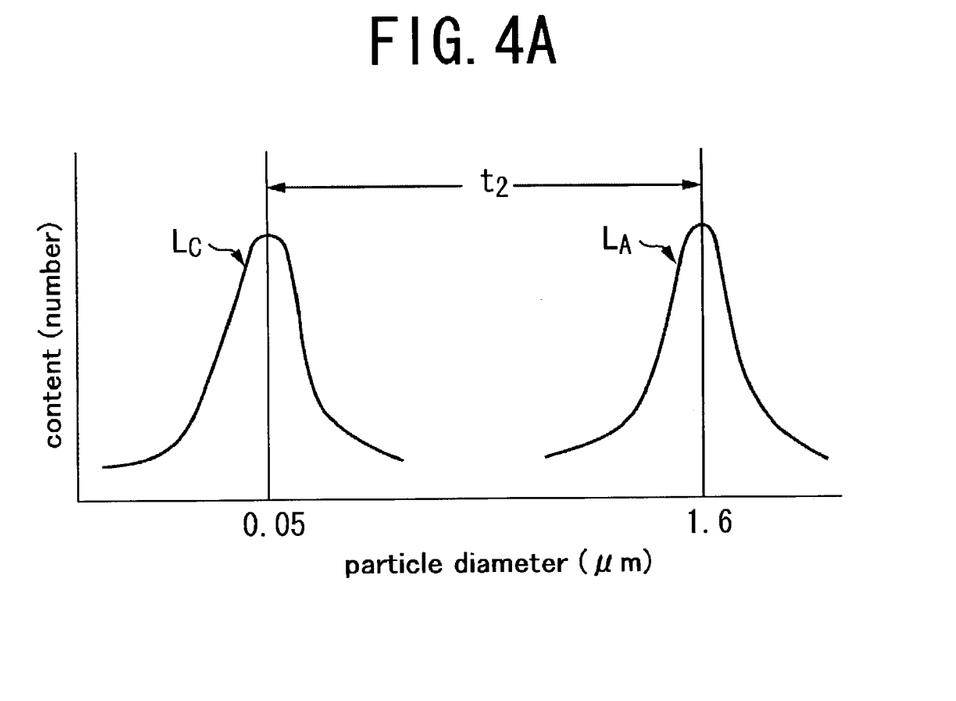
FIGS. 4A and 4B are diagrams for explaining another example of the distribution of the filler component particles in the filler material.
Figure 4B:
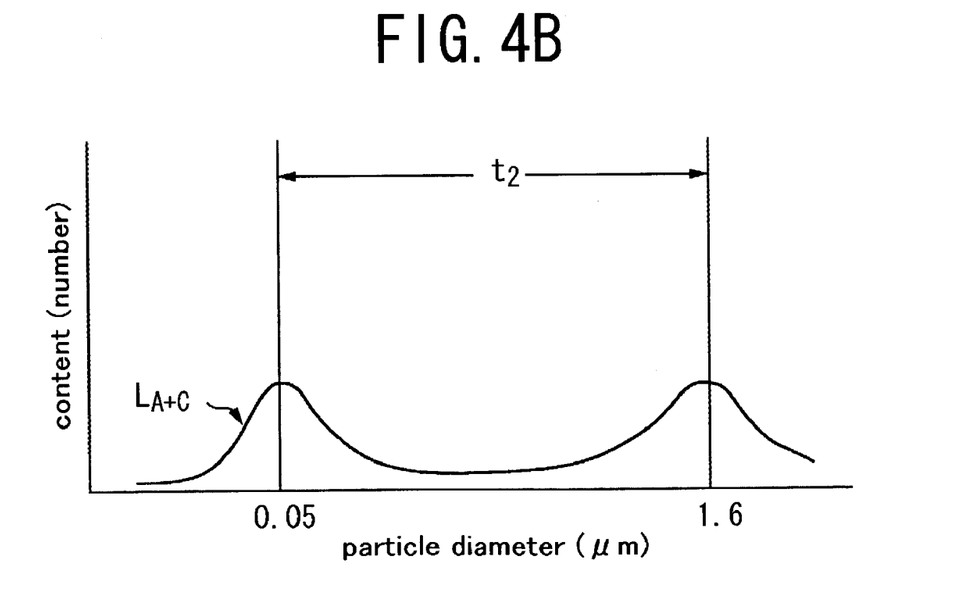

FIG. 3A shows a particle diameter distribution curve $L_A$ of the filler component A with a particle diameter distribution curve $L_B$ of the filler component B, and FIG. 3B shows a particle diameter distribution curve $L_{A+B}$ of the filler material of Example 2 using the same amounts of the filler components A and B. FIG. 4A shows a particle diameter distribution curve $L_A$ of the filler component A with a particle diameter distribution curve $L_C$ of the filler component C, and FIG. 4B shows a particle diameter distribution curve $L_{A+C}$ of the filler material of Example 6 using the same amounts of the filler components A and C. In FIGS. 3A, 3B, 4A and 4B, the abscissa axes indicate the particle diameter (μm), and the ordinate axes indicate the content (number).

The particle diameter distribution curves $L_A$, $L_B$ and $L_C$ are normal distribution curves, and therefore, the peaks are at the positions of the average particle diameters M (M=1.6 μm, 0.9 μm and 0.05 μm for the filler components A, B and C, respectively). The dispersions σ of the particle diameter distribution curves $L_A$, $L_B$ and $L_C$ are 0.14 μm, 0.1 μm and 0.007 μm, respectively. In the normal distribution, 68% of the particles are present within the particle diameter range of the average particle diameter ±σ (μm).

The differences $t_1$ and $t_2$ of the average particle diameters are large (0.7 μm or more), and the dispersions σ of the particle diameter distribution curves $L_A$, $L_B$ and $L_C$ are small. Therefore, in the cases where the filler components A and B or the filler components A and C are mixed as in Examples 2 and 6, the particle diameter distribution curves $L_{A+B}$ and $L_{A+C}$ having two peaks (first and second peaks) are obtained as shown in FIGS. 3B and 4B.

It is considered from the results that the particle diameter distribution curves of the filler materials of Examples 1 to 12 using two kinds of filler components having a difference in average particle diameter of 0.7 μm or more have first and second peaks as similar to the cases of Examples 2 and 6, and it is also considered that the rigidity of the adhesives of Examples 1 to 12 is increased owing to friction of the particles in the filler materials, whereby the excellent results shown in Table 1 are obtained.

While the cases where the adhesive is semihardened to produce the adhesive film 15 have been described, the invention is not limited to them, but for example, a film formed by adding a solid resin to the adhesive is also included therein.

It is also possible that the adhesive of the invention is not shaped into a film form, but is used for connecting the semiconductor chip 11 and the substrate 13 in a paste form as it is.

Figure 2A:
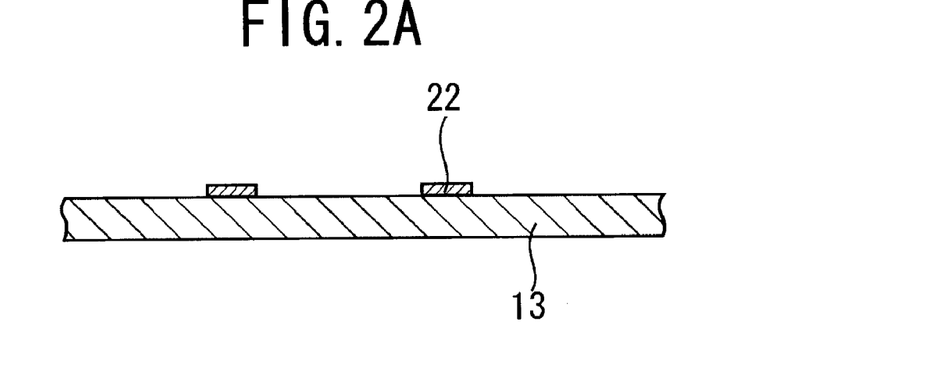
FIGS. 2A to 2C are diagrams showing another example of a method for using the adhesive of the invention.
Figure 2B:
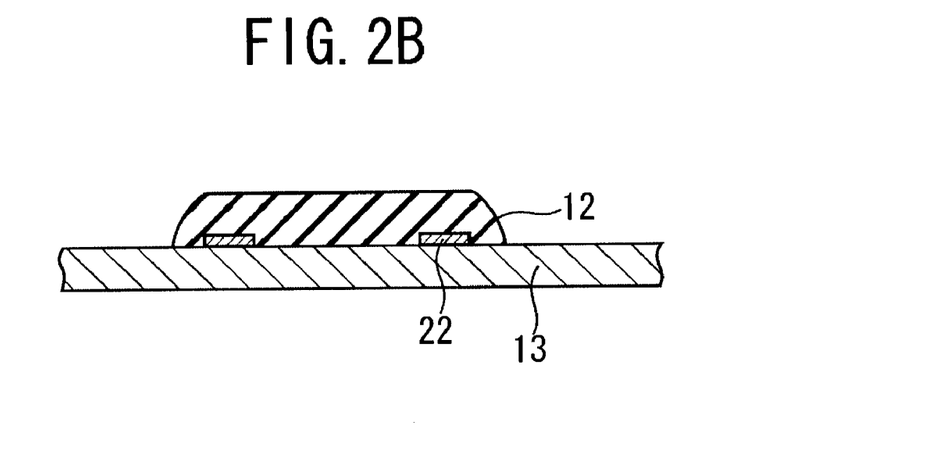

FIG. 2A shows the same substrate 13 as shown in FIG. 1A, and in order to mount a semiconductor chip 11 on the substrate 13, the adhesive in a paste form is coated on the surface of the substrate 13, on which connecting terminals 22 are arranged, to form a coated layer 12 of the adhesive (FIG. 2B).

Figure 2C:
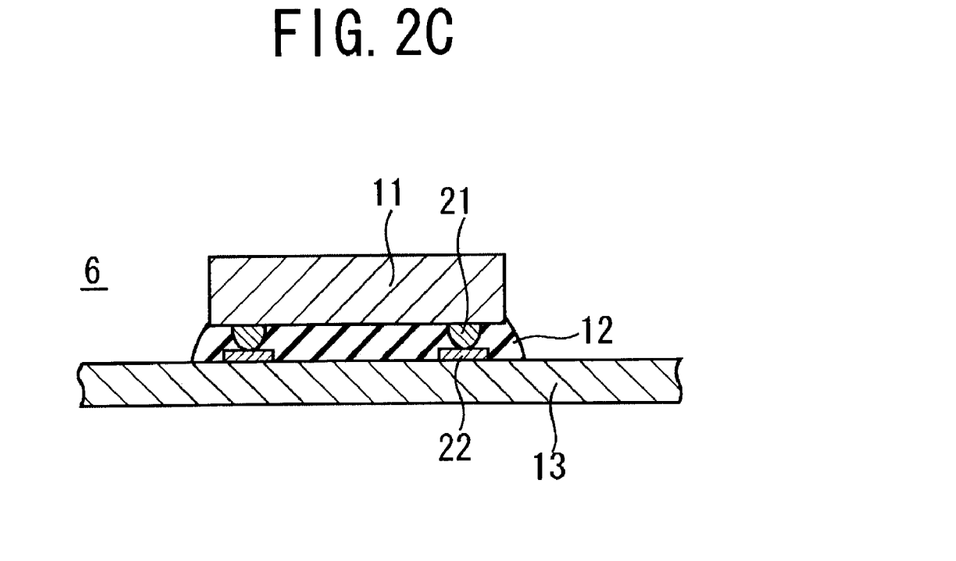

Subsequently, the surface of the substrate 13, on which the coated layer 12 is formed, is arranged to face the surface of the semiconductor chip 11, on which connecting terminals 21 are arranged, and the substrate 13 and the semiconductor chip 11 are pressed with heat according to the same process as in FIGS. 1B and 1C, whereby the adhesive of the coated layer 12 is hardened under the state where the connecting terminals 22 of the substrate 13 and the connecting terminals 21 of the semiconductor chip 11 are made in close contact with each other, so as to obtain an electric device 6 according to the invention.

While the metal plated resin particles are used as the electroconductive particles in the respective examples, the invention is not limited to them, and various kinds of materials can be used, for example, a silver paste, nickel particles, electroconductive particles formed with copper particles, and the like. The adhesive of the invention includes those containing no electroconductive particle.

While the cases where the epoxy resin as a thermosetting resin is used as the resin material of the adhesive have been described, the invention is not limited to them. For example, various kinds of materials can be used, for example, a urea resin, a melamine resin, a phenol resin and the like. The resin used in the invention is not limited to those having thermosetting nature, but photopolymerizable resins, thermoplastic resins and the like can also be used.

In the adhesive of the invention, a hardening agent for hardening the resin material may be added. Examples of the hardening agent that can be used in the adhesive of the invention include an amine series hardening agent, a phenol series hardening agent, a hydrazide series hardening agent, a mercapto series hardening agent, a dicyandiamide series hardening agent and the like. In the adhesive of the invention, various kinds of additives, such as a coupling agent, an antiaging agent, a coloring agent and the like, may be added in addition to the hardening agent.

While the cases where silica and alumina are used as the filler components have been described, the invention is not limited to them, and various kinds of materials can be used, for example, aluminum nitride, calcium carbonate, clay, beads, pulverized products of various kinds of ores, zinc oxide, resin particles, a composite oxide, such as zircon, mullite, spinel and the like, and the like. However, in the case where a filler component having electroconductivity, such as nickel and carbon black, is packed in a high density, it causes short circuit of the wiring of the electric device 5, and thus it is not suitable for the adhesive of the invention.

INDUSTRIAL APPLICABILITY

The filler particles are packed at a high density to generate a high frictional force, whereby the rigidity of the adhesive is improved to obtain an electric device of high reliability.

The invention claimed is:
1. An adhesives, comprising:
a filler material;
electroconductive particles; and
a resin material,
the filler material having an average particle diameter of 0.05 μm to 1.6 μm and a particle diameter distribution having a first peak and a second peak positioned on a side of smaller particle diameters with respect to the first peak, and a difference between a particle diameter, at which the first peak is positioned, and a particle diameter, at which the second peak is positioned, being 0.7 µm or more.

2. An adhesive as claimed in claim 1, wherein the filler material contains two or more kinds of filler components that have average particle diameters different from each other.

3. An adhesive as claimed in claim 2, wherein the filler components contain one or both of silica and alumina.

4. An adhesive as claimed in claim 1, wherein the adhesive has been previously semihardened and shaped into a sheet form.

5. An electric device comprising a semiconductor chip, a substrate and the adhesive as claimed in claim 1 arranged between the semiconductor chip and the substrate and hardened by a heat treatment.

6. An adhesive as claimed in claim 1, wherein the adhesive has been previously semihardened and shaped into a sheet form.

7. An adhesive as claimed in claim 2, wherein the adhesive has been previously semihardened and shaped into a sheet form.

8. An adhesive as claimed in claim 3, wherein the adhesive has been previously semihardened and shaped into a sheet form.

9. An electric device comprising a semiconductor chip, a substrate and the adhesive as claimed in claim 2 arranged between the semiconductor chip and the substrate and hardened by a heat treatment.

10. An electric device comprising a semiconductor chip, a substrate and the adhesive as claimed in claim 3 arranged between the semiconductor chip and the substrate and hardened by a heat treatment.

11. An electric device comprising a semiconductor chip, a substrate and the adhesive as claimed in claim 4 arranged between the semiconductor chip and the substrate and hardened by a heat treatment.

* * * * *

UNITED STATES PATENT AND TRADEMARK OFFICE
CERTIFICATE OF CORRECTION

PATENT NO. : 7,041,237 B2 Page 1 of 1
APPLICATION NO. : 10/312043
DATED : May 9, 2006
INVENTOR(S) : Yasushi Akutsu It is certified that error appears in the above-identified patent and that said Letters Patent is hereby corrected as shown below:

On the title page:

Please delete the following:

(73)     Assignee:     Sony Corporation, Tokyo (JP)

And replace with:

(73)     Assignee:     Sony Corporation, Tokyo (JP)
                       Sony Chemicals Corp., Tokyo (JP)

Signed and Sealed this

Nineteenth Day of December, 2006

JON W. DUDAS
*Director of the United States Patent and Trademark Office*